United States Patent [19]

Kolem et al.

[11] Patent Number: 5,442,292
[45] Date of Patent: Aug. 15, 1995

[54] NUCLEAR MAGNETIC RESONANCE APPARATUS HAVING AT LEAST TWO TRANSMISSION FREQUENCIES

[75] Inventors: Heinrich Kolem, Effeltrich; Wilfried Schnell, Forchheim; Rolf Sauter, Fuerth; Karsten Wicklow; Hermann Requardt, both of Erlangen, all of Germany

[73] Assignee: Siemens Aktiengesellschaft, Munich, Germany

[21] Appl. No.: 282,505

[22] Filed: Aug. 1, 1994

[30] Foreign Application Priority Data

Aug. 3, 1993 [DE] Germany ............... 43 26 045.4

[51] Int. Cl.⁶ ............................................. G01V 3/00
[52] U.S. Cl. ..................................... 324/322; 324/318; 128/653.5
[58] Field of Search ............... 324/300, 307, 309, 312, 324/314, 318, 322; 128/653.5

[56] References Cited

U.S. PATENT DOCUMENTS 5,099,206  3/1992  Imaizumi et al. .............. 324/322
5,166,620  11/1992  Panosh ............................ 324/322

*Primary Examiner*—Louis Arana
*Attorney, Agent, or Firm*—Hill, Steadman & Simpson

[57] ABSTRACT

For improving the spectral resolution and/or the signal-to-noise ratio of a nuclear magnetic resonance apparatus for examining first types of atomic nuclei that are nuclear-magnetically coupled to second types of atomic nuclei, signals are additionally emitted on the resonant frequency of the second type of atomic nucleus during the examination of the first type of atomic nucleus. To this end, the nuclear magnetic resonance apparatus includes a reception channel and only one transmission channel for both resonant frequencies. The transmission channel contains a respective synthesizer for each resonant frequency, which define the transmission frequency and contains a modulator unit shared in common by both resonant frequencies.

4 Claims, 4 Drawing Sheets

NUCLEAR MAGNETIC RESONANCE APPARATUS HAVING AT LEAST TWO TRANSMISSION FREQUENCIES

BACKGROUND OF THE INVENTION

1 Field of the Invention

The present invention is directed to a nuclear magnetic resonance apparatus for the examination of first types of atomic nuclei that are nuclear-magnetically coupled to second types of atomic-nuclei.

2. Description of the Prior Art

The distribution of protons bonded in water molecules is the usual phenomenon investigated using a medical nuclear magnetic resonance apparatus, particularly a nuclear magnetic resonance tomography apparatus. These protons bonded in water molecules occur frequently in life forms and images having a good signal-to-noise ratio are obtained. For specific diagnostic inquiries, however, the examination of phosphorous ($^{31}P$) or carbon ($^{13}C$), for example, can provide more meaningful information. These atomic nuclei, however, are encountered in substantially lower concentrations in biological tissue. They are nuclear-magnetically coupled to the protons, so that the line width of resonant lines, for example, is substantially enlarged in spectroscopy, and thus the spectral resolution suffers. So-called decoupling pulses are therefore generally superimposed on the resonant frequency of the protons during the signal acquisition of the non-proton nuclei nuclear magnetic resonance signals. The technique thereby employed is described in the article by P. R. Luyten, "Broadband Proton Decoupling in Human $^{31}P$-NMR Spectroscopy" in NMR in Biomedicine, vol. 1, no. 4, 1989, pp. 177–183.

It is also known that a clear signal boost of the non-proton nuclei nuclear magnetic resonance signals can be achieved on the basis of the nuclear Overhauser effect by exciting protons before the excitation of the phosphorous atoms. This technique is described in the article by P. Bachert-Baumann, "In Vivo Nuclear Overhauser-effect in $^{31}P$-$^{1}H$ Double Resonance Experiments in a 1.5-T Whole Body MR System" in Magnetic Resonance in Medicine 15, 1990, pp. 165–172.

Both in the decoupling and in the exploitation of the nuclear Overhauser effect, the examination subject must be charged not only with the resonant frequency of the type of atomic nuclei actually to be examined (for example $^{31}P$ or $^{13}C$) but also must be charged with radio-frequency pulses on the proton resonant frequency. For this purpose, the conventional approach has been to equip a nuclear magnetic resonance apparatus with a second radio frequency channel (as explicitly recited, for example, in the second of the aforementioned references). This, however, involves substantial outlay.

U.S. Pat. No. 4,677,382 discloses the expansion of an NR apparatus that is initially suited only for one type of nucleus, by equipment so that a second type of nucleus can also be examined. To that end, two frequency converters are provided with which the transmission signal and the reception signal upon examination of the second type of nucleus are converted onto the Larmor frequency of the first type of nucleus by superimposition.

SUMMARY OF THE INVENTION

It is an object of the invention to provide a nuclear magnetic resonance apparatus wherein types of atomic nuclei that are nuclear-magnetically coupled to second types of atomic nuclei can be examined with little outlay.

The above object is achieved in accordance with the principles of the present invention in a nuclear magnetic resonance apparatus for investigating a first type of atomic nuclei, having a first resonant frequency, which are nuclear-magnetically coupled in the presence of a basic magnetic field to a second type of atomic nuclei, having a second resonant frequency, wherein the atomic nuclei of the first type are excited at the first resonant frequency by high-frequency fields during an excitation phase and thereby generating nuclear magnetic resonance signals which are read out during a read-out phase, and wherein high-frequency fields at the second resonant frequency are also emitted into the examination subject during the read-out phase, and wherein the apparatus has a reception channel with a demodulator unit for demodulating the nuclear magnetic resonance signals, and only a single transmission channel for both of the resonant frequencies, which contains a modulator unit shared in common by both resonant frequencies. Synthesizers are respectively provided for generating each resonant frequency, with the synthesizer which defines the first resonant frequency controlling the demodulator unit of the reception channel at least during the read-out phase, and also controlling the modulator unit of the transmission channel during the excitation phase. The synthesizer which defines the second resonant frequency controls the modulator unit of the transmission channel during the read-out phase.

DESCRIPTION OF THE PREFERRED EMBODIMENTS

Figure 1:
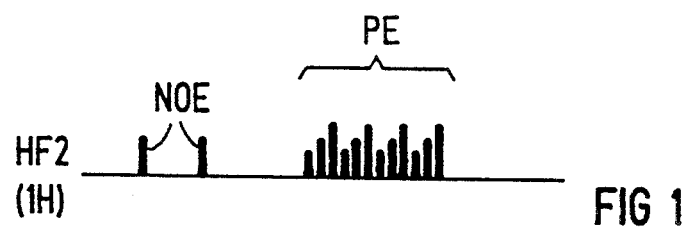
FIGS. 1–3 schematically show a pulse sequence with nuclear Overhauser effect pulses and decoupling pulses.
Figure 2:
Figure 3:
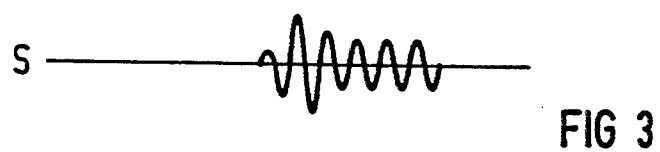

FIGS. 1–3 show a pulse sequence for the excitation of phosphorous atoms with application of the nuclear Overhauser effect and with nuclear-magnetic decoupling between protons and phosphorous atoms. A sequence of so-called NOE (nuclear Overhauser effect) high-frequency pulses are thereby emitted first, with a second high-frequency HF2 that is equal to the resonant frequency $\omega_H$ of the protons in the predetermined basic magnetic field. According to FIG. 2, subsequently, a high-frequency excitation pulse is emitted with a first high-frequency HF1 that is equal to the resonant frequency $\omega_P$ of phosphorous atoms in the predetermined basic magnetic field. Finally, the read-out phase follows wherein the arising nuclear magnetic resonance signal S of the phosphorous atoms is read out according to FIG. 3. According to FIG. 1, a plurality of decoupling pulses PE having the second frequency, i.e. the resonant frequency $\omega_H$ of the protons, is emitted during the read-out phase. With respect to the more detailed fashioning of the NOE pulses as well as their functioning, the aforementioned article by P. Bachert-Baumann et al., "In Vivo Nuclear-Overhauser-effect in $^{31}$P-$^{1}$H Double Resonance Experiments in a 1.5 Whole-Body MR-System" in Magnetic Resonance in Medicine 15, pp. 165–172 (1990) as well as U.S. Pat. No. 5,189,390 are referenced. The aforementioned reference of P. R. Luyten is referenced with respect to the more detailed fashioning and functioning of the decoupling pulses. A specific pulse sequence for decoupling pulses, further, may be found in the article by A. J. Shaka, "An Improved Sequence for Broadband Coupling: WALTZ-16", in Journal of Magnetic Resonance 52, pp. 335–338 (1983).

In a known way, of course, gradient pulses can also be applied in addition to the high-frequency pulses shown in FIGS. 1 and 2 in order, for example, to produce echo signals and/or a spatial resolution. Since the invention, however, is exclusively directed to the high-frequency part, the gradient pulses need not be discussed in greater detail here.

Figure 4:
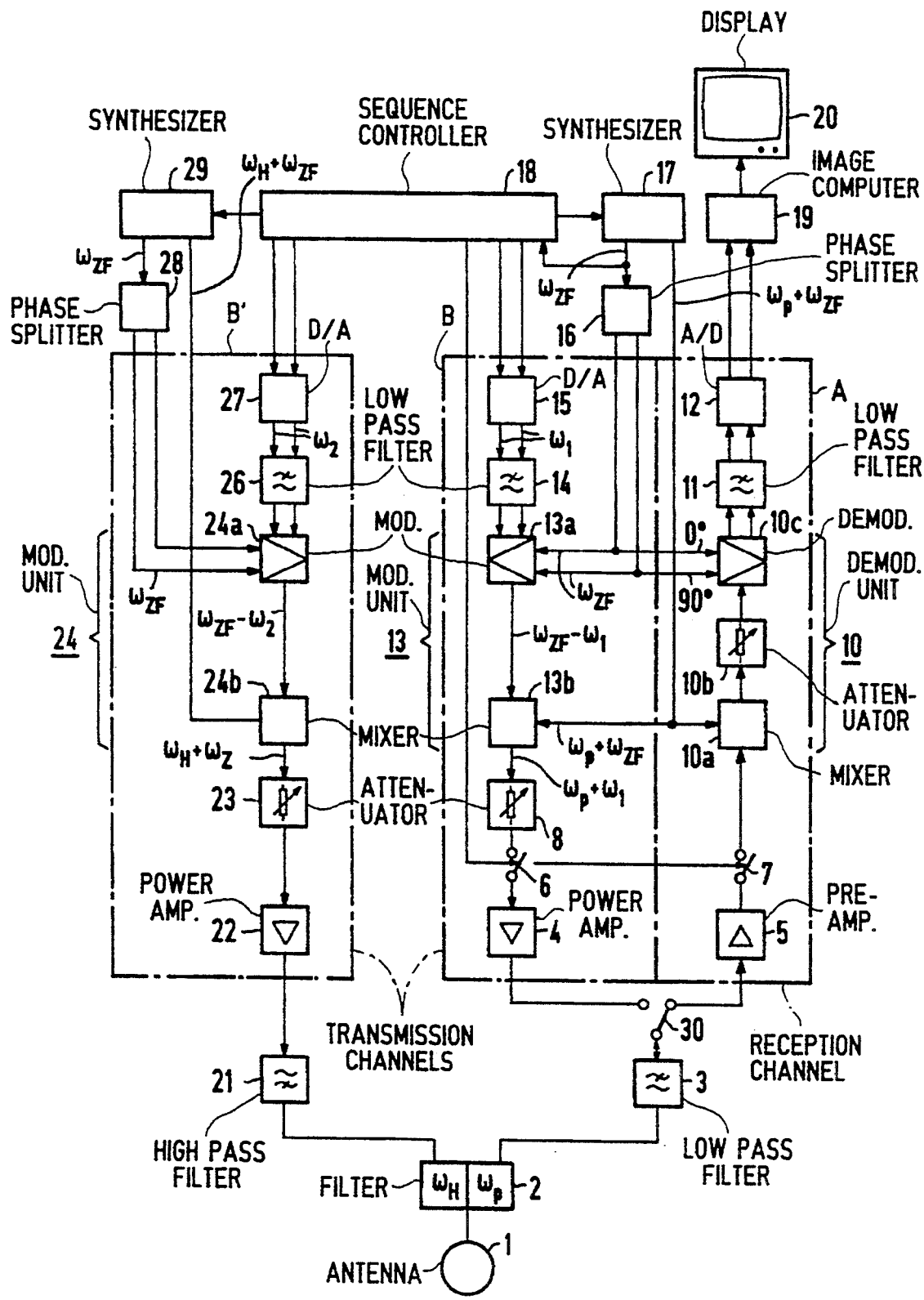
FIG. 4 is a block diagram of a conventional nuclear magnetic resonance apparatus having two complete transmission channels according to the prior art.

For explaining the problematic, the high-frequency part of a nuclear magnetic resonance apparatus with which transmission can be carried out on two frequencies is schematically shown in FIG. 4. The book by E. Krestel, *Bildgebende Systeme fer die medizinische Diagnostik*, 2nd edition, 1988, Siemens AG, pp. 479–543 is referenced for a presentation of an overall apparatus.

The curve shape of the HF pulses required for producing nuclear magnetic resonance signals is digitally offered by a sequence controller 18 as a sequence of complex numbers. The magnitude of a complex numerical value thereby corresponds to the momentary amplitude and the phase relation corresponds to the direction of the electromagnetic field in a coordinate system rotating with the resonant frequency of the respective nuclear spins. The digital values representing the real part and the imaginary part of each complex number are supplied to two transmission channels B and B'. In the transmission channel B, the incoming digital signals are converted into low-frequency voltage pulses in two digital-to-analog converters 15, and the undesired harmonics arising due to the digital generation of the pulse shape are suppressed by low-pass filters 14. The low-frequency signals generated in this way, which prescribe the pulse shape of the high-frequency pulses, are supplied to a modulator unit 13. The modulator unit 13 is composed of the actual modulator 13a, which is implemented as a single-sideband modulator, and a following mixer 13b. The single-sideband modulator 13a multiplies the complex pulse shape of the low-frequency signal present at the output of the low-pass filter 14 by a complex carrier signal. A modulator can be realized best when the frequency range is adequately narrowband. Since certain variations in the output frequency are necessary, a uniform intermediate frequency $\omega_{ZF}$ is employed as the carrier. This intermediate frequency $\omega_{ZF}$ is generated in a synthesizer 17, whereby two high-frequency signals offset by 90° are acquired with a phase splitter 16.

When the frequency of the low-frequency signals prescribed by the sequence controller is $\omega_1$, a modulated signal having the frequency $\omega_{ZF}-\omega_1$ is thus present at the output of the modulator 13a. The mixer 13b following the modulator 13a that generates a high-frequency signal having a center frequency corresponding to the nuclear magnetic resonant frequency, i.e. a center frequency that corresponds to the resonant frequency $\omega_P$ of phosphorous atoms in the illustrated example. To that end, a signal having the frequency $\omega_P+\omega_{ZF}$ is supplied to the mixer by the synthesizer 17 in addition to the output signal of the modulator 13a having the frequency $\omega_{ZF}-\omega_1$. The difference frequency $\omega_P+\omega_1$ is thus obtained. The modulator 13a and the mixer 13b are referenced together as modulator unit 13.

The transmission power is adapted to different demands of the system with a controllable, variable attenuation element 8. A gate circuit 6 blocks the transmission path as long as the system is in the reception mode. What is thus avoided is that noise and carrier signal from the modulator unit 13 proceed into the reception circuit via the power amplifier 4 and disturb the weak MR signal. The high-frequency signal is subsequently amplified with a power amplifier 4. The transmission circuit of the reception circuit (described below) is optionally connected to an antenna 1 by a transmission/reception diplexer 30.

When, as in the present instance, two different transmission frequencies are required, a high-pass filter 21 follows the transmission branch having the higher frequency and a lower-pass filter 3 follows the transmission branch having the lower frequency in order to decouple the transmission branches from one another. Further, the antenna 1 is connected via a filter box 2 that separates the two frequencies from one another.

The other transmission channel B', which is the same as the above-described transmission channel B, is provided for the second resonant frequency, with components in channel B' which function the same as those described above in connection with channel B having the same label, but different reference numerals. The synthesizer 29 in the second transmission channel B' uses the same intermediate frequency $\omega_{ZF}$ but also generates a variable frequency $\omega_H+\omega_{ZF}$ that is matched to the resonant frequency of the second type of atomic nuclei (in this case, to that of the protons). This frequency is supplied to a mixer 24b which is also supplied with the output of the modulator 24a, and produces a difference signal $\omega_H+\omega_{ZF}$. Since protons have a higher resonant frequency than phosphorous atoms, this transmission branch B' is connected to the corresponding input of the filter 2 via a high-pass filter 21.

Only one reception channel A is provided, since the nuclear magnetic resonance signals of only one type of atomic nucleus are received at any one time. In the reception channel A, the signal is supplied via a preamplifier 5 to a mixer 10a that brings the frequency band lying around the nuclear magnetic resonant frequency $\omega_P$ of the phosphorous atoms investigated into the intermediate frequency range $\omega_{ZF}$, so that an attenuator 10b and a demodulator 10c that are independent of the reception frequency can be employed. The mixers 10a, attenuator 10b and demodulator 10c are referenced together as demodulator unit 10. The received nuclear magnetic resonance signal is demodulated phase-dependent in the demodulator 10c and the real part and imaginary part are supplied via a low-pass filter 11 and via a redundantly implemented analog-to-digital converter 12 to a computer 19 that, dependent on the application, calculates a spectrum or an image of the distribution of the type of nucleus under examination from the received signal, and displays the spectrum or image on a monitor 20.

The second transmission channel B' present in the illustrated prior art causes a substantial added outlay. This added outlay can be avoided when, in accordance with the invention, a single transmission channel is used for both transmission frequencies, i.e., for example, for the excitation of the protons as well as for the excitation of the phosphorous atoms in the exemplary embodiment. This becomes possible because simultaneous transmission on both resonant frequencies is not necessary given, for example, NOE pulses and decoupling pulses.

Figure 5:
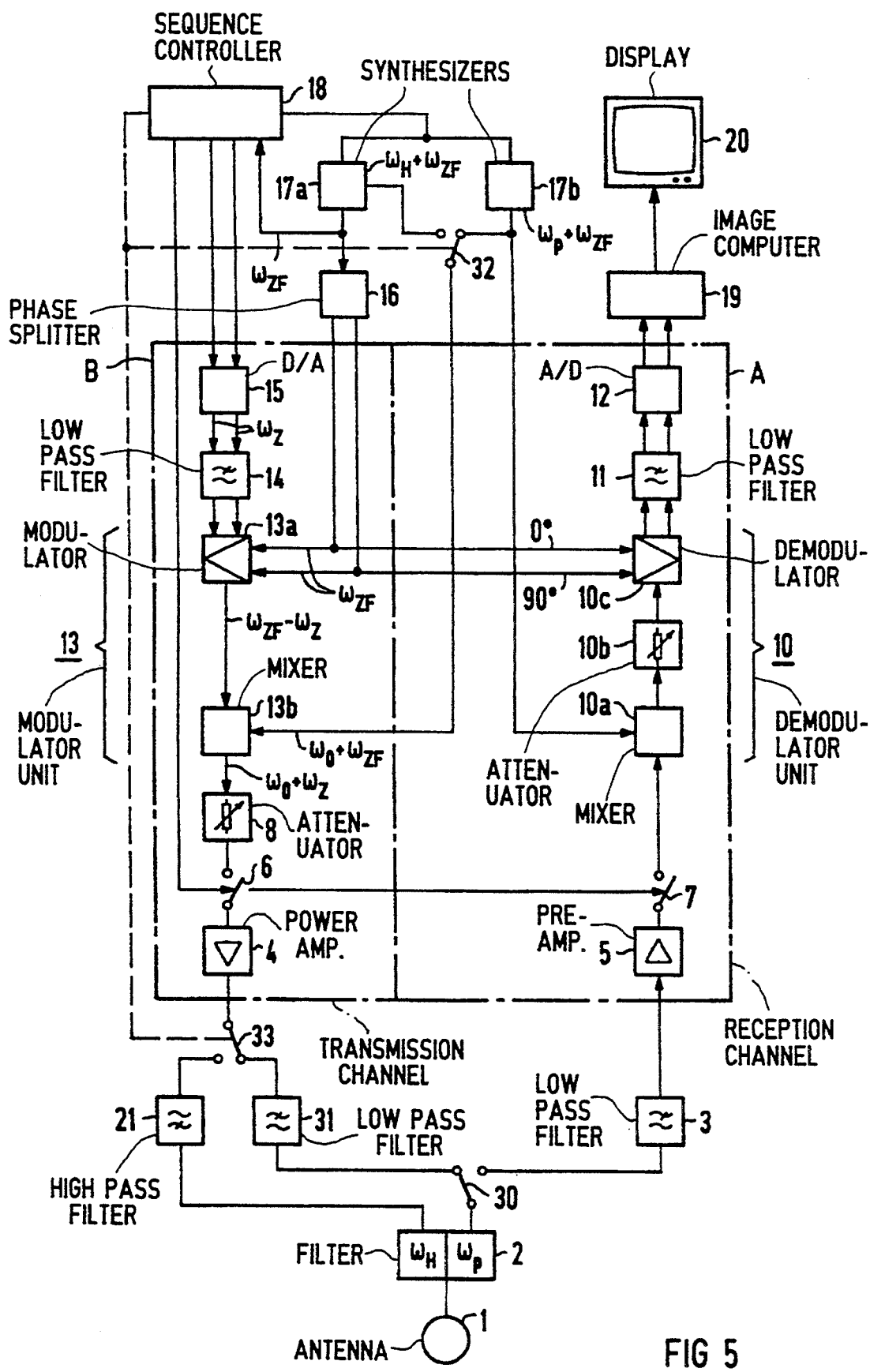
FIG. 5 is a block diagram of a first exemplary embodiment of the invention having two switch-over means.

A first exemplary embodiment of the inventive apparatus is shown in FIG. 5. The transmission channel B is thereby identical to the transmission channel B of FIG. 4, and thus the components thereof are identically labelled. Two synthesizers 17a and 17b are provided, one (17a) generating the resonant frequency of the protons plus the intermediate frequency ($\omega_H + \omega_{ZF}$) and the other (17b) generating the resonant frequency of the phosphorous atoms plus the intermediate frequency ($\omega_P + \omega_{ZF}$). Via a switching stage 32, the mixer 13b of the modulator unit 13 in the transmission circuit B is driven with the frequency $\omega_H + \omega_{ZF}$ when transmitting on the proton resonant frequency. By switching the switching stage 32, the mixer 13b is charged with the frequency $\omega_P + \omega_{ZF}$ when transmitting on the phosphorous atom resonant frequency. The mixer 10a of the demodulator unit in the reception circuit A always remains connected to the synthesizer 17b and is thus charged with the frequency $\omega_P + \omega_{ZF}$. The intermediate frequency $\omega_{ZF}$ remains the same in all instances.

A second switching stage 33 is also present in the exemplary embodiment of FIG. 5, this switching stage 33 connecting the power amplifier 4 of the transmission channel B either to the proton input of the filter 2 via a high-pass filter 21 or to the phosphorous input of the filter 2 via a low-pass filter 31 and the transmission/reception diplexer 30, dependent on the transmission frequency.

The two switching stages 32 and 33 are operated via the sequence controller 18.

A typical measurement according to the pulse sequence of FIGS. 1 and 2 takes place as follows in the inventive apparatus. The first synthesizer 17b having the output frequency $\omega_P + \omega_{ZF}$ constantly feeds the mixer 10a of the reception branch A and also constantly feeds the mixer 13b of the transmission channel B in the illustrated position of the switching stage 32. For the NOE pulses of FIG. 1, the switching stages 32 and 33 are actuated and high-frequency pulses are transmitted on the proton resonant frequency, the envelope of these pulses being predetermined by the sequence controller 18. After this, the switching stages 32 and 33 are returned into the illustrated position and an excitation pulse of FIG. 2 is transmitted on the phosphorous resonant frequency. Subsequently, the switching stages 32 and 33 are actuated again, so that the transmission channel B is again set to the proton resonant frequency. While the arising phosphorous signal of FIG. 3 is being demodulated in the reception part, the decoupling pulse PE of FIG. 1 is transmitted on the proton resonant frequency.

In the illustrated arrangement, thus, the transmission mode is possible with two different frequencies given simultaneous reception on one of the two frequencies with little added outlay (namely, a second synthesizer and two switching stages).

Figure 6:
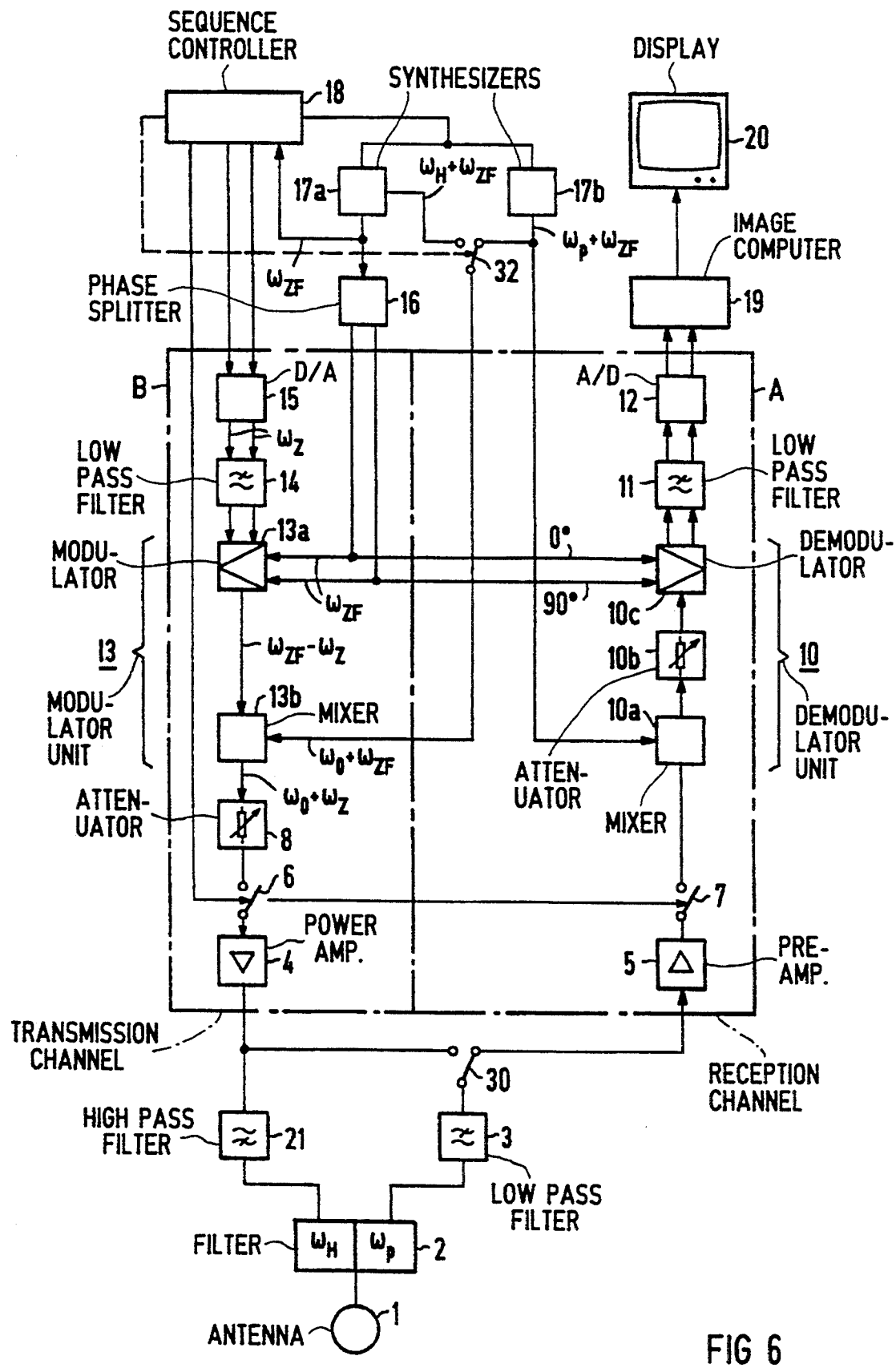
FIG. 6 is a block diagram of a second exemplary embodiment of the invention that operates with one switch-over means in the transmission channel.

When the transmission/reception diplexer 30 comprises the high degree of isolation, the switching stage 33 can be foregone. A corresponding circuit is shown in FIG. 6.

This circuit differs from that of FIG. 5 only in that the power amplifier 4 of the transmission branch B is directly connected to the transmission/reception diplexer 30 and is connected to the proton input of the filter 2 via the high-pass filter 21. The drive is also carried out as set forth above, whereby the drive of the second switching stage 33 is merely eliminated.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a nuclear magnetic resonance apparatus for investigating atomic nuclei of a first type having a first resonant frequency, which are nuclear-magnetically coupled in the presence of a basic magnetic field to atomic nuclei of a second type, having a second resonant frequency, means for exciting said atomic nuclei of the first type with said first resonant frequency by high-frequency fields during an excitation phase and thereby generating nuclear magnetic resonance signals which are read out during a read-out phase, and means for exciting said atomic nuclei of the second type by generating high-frequency fields at said second resonant frequency during said read-out phase, the improvement of a transmission/reception unit comprising:

a reception channel containing a phase-sensitive demodulator unit;

a single transmission channel for both of said resonant frequencies containing a modulator unit used in common for modulating respective signals with each of said resonant frequencies;

a first synthesizer for generating a first signal at said first resonant frequency and a second synthesizer for generating a second signal said second resonant frequency;

said first synthesizer being connected to said demodulator unit of said reception channel at least during said read-out phase for supplying said first signal thereto as a frequency and phase reference and also being connected to said modulator unit of said transmission channel during said excitation phase for supplying said first signal thereto as a basic frequency; and said second synthesizer being connected to said modulator unit of said transmission channel during said read-out phase for supplying said second signal thereto as a basic frequency.

2. A nuclear magnetic resonance apparatus as claimed in claim 1 further comprising:

a high-frequency antenna;

a filter for separating signals at the first and second resonant frequencies having a first terminal at which signals having said first resonant frequency are present and a second terminal at which signals having said second resonant frequency are present;

a transmission/reception diplexer connected to said first terminal of said filter;

an output amplifier connected at an output of said transmission channel; and switching means for selectively connecting said output amplifier to said second terminal of said filter or to said transmission/reception diplexer.

3. A nuclear magnetic resonance apparatus as claimed in claim 2 further comprising a high-pass filter connected between said switching means and said second terminal of said filter and a low-pass filter connected between said switching means and said transmission/reception diplexer.

4. A nuclear magnetic resonance apparatus as claimed in claim 1 wherein said transmission channel includes means using said first synthesizer for emitting Overhauser pulses before exciting said atomic nuclei of said first type with said first synthesizer controlling said modulator unit in said transmission channel.

* * * * *